United States Patent
Miyajima et al.

(10) Patent No.: US 6,344,420 B1
(45) Date of Patent: Feb. 5, 2002

(54) PLASMA PROCESSING METHOD AND PLASMA PROCESSING APPARATUS

(75) Inventors: Hideshi Miyajima; Keiji Fujita, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/525,038

(22) Filed: Mar. 14, 2000

(30) Foreign Application Priority Data

Mar. 15, 1999 (JP) .......................................... 11-068079
Mar. 18, 1999 (JP) .......................................... 11-073065

(51) Int. Cl.⁷ .............................................. H01L 21/31
(52) U.S. Cl. ...................... 438/758; 438/700; 438/710; 118/720; 118/723; 156/345; 156/627
(58) Field of Search ................................ 438/758, 700, 438/710; 118/723, 720; 156/345, 627.1

(56) References Cited

U.S. PATENT DOCUMENTS 5,061,359 A * 10/1991 Babu et al. .................. 204/298
5,554,223 A * 9/1996 Imahashi ..................... 118/723
5,571,366 A * 11/1996 Ishii et al. ................... 156/345

FOREIGN PATENT DOCUMENTS

JP  9-246244  9/1997

* cited by examiner

Primary Examiner—Vu A. Le
Assistant Examiner—Pho Luu
(74) Attorney, Agent, or Firm—Finnegan, Henderson, Farabow, Garrett, & Dunner, L.L.P.

(57) ABSTRACT

In a parallel-plate type plasma processing apparatus including an upper electrode having a plurality of gas introducing inlets and a support table serving as a lower electrode opposed to the upper electrode and having a silicon wafer thereon, the open ends of the inlets are expanded in their diameter directions.

11 Claims, 5 Drawing Sheets

PLASMA PROCESSING METHOD AND PLASMA PROCESSING APPARATUS

CROSS-REFERENCE TO RELATED APPLICATIONS

This application is based upon and claims the benefit of priority from the prior Japanese Patent Applications No. 11-068079, filed Mar. 15, 1999; and No. 11-073065, filed Mar. 18, 1999, the entire contents of which are incorporated herein by reference.

BACKGROUND OF THE INVENTION

The present invention relates to a plasma processing method and a plasma processing apparatus for processing a subject using plasma generated by applying a voltage between upper and lower electrodes.

In a plasma processing apparatus of a parallel-plate type, as a wafer increases in diameter, it is required that plasma be uniformed in order to make the thickness of the wafer more uniform within the wafer plane and plasma is increased in density between upper and lower electrodes in order to make plasma processing more efficient.

In the parallel-plate type plasma processing apparatus having large electrodes to form a film on the large-diameter wafer, however, pressure and plasma density are varied with a distance between the upper and lower electrodes. The apparatus therefore has a problem where in-plane uniformity of plasma processing (uniformity of deposition temperature and deposition quality in CVD, that of etching rate and etching shape in etching, etc.) cannot be obtained sufficiently even by controlling pressure, an electrode-to-electrode interval, a gas flow rate, and the like.

FIG. 1 is a general view showing a structure of a prior art plasma processing apparatus. Referring to FIG. 1, a reaction chamber 1 includes a vacuum outlet 11 to allow plasma processing under a reduced pressure. An upper electrode 3 has a gas pipe 4 for introducing gas and serves as a plurality of gas introducing inlets (dispersion nozzles) 5. A high-frequency power supply (not shown) is connected to the upper electrode 3. A silicon wafer 7, which is a subject to be processed, is placed on a support table 2 including a resistance heating heater 8 for controlling the temperature of the wafer 7. The high-frequency power supply (not shown) is connected to the support table 2. A magnet (not shown) is provided outside the chamber 1 to generate a magnetic field on the wafer 7 and increase the density of discharged plasma.

Using the above-described plasma processing apparatus, a silicon oxide thin film containing fluorine is deposited on a silicon wafer through the following process. First, the reaction chamber 1 is evacuated by the vacuum outlet 11, and then the wafer 7 is put on the support table 2 and heated to a desired temperature of 370° C. using the heater 8. After that, $SiF_4$ of 25 cc/min (scum) and $O_2$ of 50 cc/min (scum) are introduced as gas materials into the chamber 1 through the gas inlets 5, and a high-frequency voltage of 27.12 MHz is applied to the upper electrode 3 using the high-frequency power supply (not shown) to discharge plasma. The silicon oxide film is thus completed. In this process, the internal pressure of the chamber 1 is 4 Pa and the intensity of the magnet is 120 Gauss. A high-frequency voltage of 13.56 MHz is applied to the support table 2 using the high-frequency power supply. All the gas inlets 5 of the upper electrode 3 have the same shape. In the prior art parallel-plate type plasma processing apparatus, however, high-density plasma is concentrated near the upper electrode 3. If, therefore, gas such as $SiF_4$, which is harder to discharge than $O_2$, is employed, it cannot be decomposed sufficiently in the above high-density plasma concentrating area, with the result that a uniform discharge is difficult to obtain, and neither uniformity of thickness nor that of fluorine (F) concentrations can be obtained within the plane of the large-diameter wafer.

In the prior art plasma processing apparatus described above, since all the gas inlets have the same shape, high-density plasma is concentrated near the upper electrode. Therefore, when gas, which is hard to discharge, is used, it is not decomposed sufficiently and the speed of plasma processing is decreased.

BRIEF SUMMARY OF THE INVENTION

The present invention has been developed in order to resolve the above problem and its object is to provide a plasma processing method and a plasma processing apparatus which increase in plasma processing speed.

Another object of the present invention is to provide a plasma processing method and a plasma processing apparatus which improve in in-plane uniformity of plasma processing speed.

According to a first aspect of the present invention, there is provided a plasma processing method comprising: applying a voltage between a lower electrode on which a subject to be processed is placed and an upper electrode opposed to the lower electrode and including a plurality of gas introducing inlets facing the lower electrode, at least some of the inlets being expanded in a diameter direction at open ends thereof; introducing a material gas from the inlets to generate plasma; and processing the subject using the plasma.

According to a second aspect of the present invention, there is provided a plasma processing method comprising: applying a voltage between a lower electrode on which a subject to be processed is placed and an upper electrode opposed to the lower electrode and including a plurality of gas introducing inlets facing the lower electrode to generate plasma, an interval between the lower electrode and open ends of the plurality of inlets being varied with an in-plane position of the upper electrode; and processing the subject using the plasma.

According to a third aspect of the present invention, there is provided a plasma processing method of processing a subject using plasma generated by applying a voltage between a lower electrode on which the subject is placed and an upper electrode opposed to the lower electrode and including a plurality of gas inlets facing the lower electrode, wherein a shield plate having a plurality of holes is disposed between the upper electrode and the lower electrode.

According to a fourth aspect of the present invention, there is provided a plasma processing apparatus of a parallel-plate type comprising a lower electrode on which a subject to be processed is placed and an upper electrode opposed to the lower electrode and having a plurality of gas inlets facing the lower electrode, wherein at least some of the plurality of gas inlets are expanded in a diameter direction at open ends thereof.

According to a fifth aspect of the present invention, there is provided a plasma processing apparatus of a parallel-plate type comprising a lower electrode on which a subject to be processed is placed and an upper electrode opposed to the lower electrode and having a plurality of gas inlets facing the lower electrode, wherein an interval between the lower electrode and open ends of the plurality of inlets is varied with an in-plane position of the upper electrode.

According to a sixth aspect of the present invention, there is provided a plasma processing apparatus of a parallel-plate type comprising a lower electrode on which a subject to be processed is placed and an upper electrode opposed to the lower electrode and having a plurality of gas inlets facing the lower electrode, wherein a shield plate having a plurality of holes is disposed between the upper electrode and the lower electrode.

In one aspect of the present invention, since at least some of plural gas introducing inlets are formed in the upper electrode such that their open ends are expanded in their diameter directions, a high-density plasma region, which is formed when plasma is discharged, can be broadened. Consequently, the high-density plasma region is not concentrated near the upper electrode, but increases gas dissociation efficiency and improves a plasma processing rate.

When at least two different gases are introduced, the open end of an inlet for introducing gas whose dissociation efficiency is low in plasma is expanded in its diameter direction more greatly than that of an inlet for introducing gas whose dissociation efficiency is high. The gas having a low dissociation efficiency in plasma can thus be promoted in dissociation.

Since, moreover, the open ends of the gas introducing inlets are varied in diameter with an in-plane position of the upper electrode, not only the plasma processing rate can be improved, but also the distribution characteristics of the plasma processing rate can be controlled. Since, in particular, the diameters of the inlets in the outer region are set larger than that in the center of the upper electrode, the plasma processing rate can be uniformed.

In another aspect of the present invention, a distance between the lower electrode and the open ends of the plural gas introducing inlets is varied with an in-plane position of the upper electrode, so that the distribution characteristics of plasma processing rate can be controlled. Since, in particular, the distance in the outer region of the upper electrode is set shorter than that in the center thereof, the plasma processing rate can be uniformed.

In still another aspect of the present invention, since a shield plate having a plurality of holes is disposed between the upper and lower electrodes, gas whose dissociation efficiency is relatively low is introduced from the high-density plasma region into the low-density plasma region, and collides with the shield plate and returns to the high-density plasma region, thereby promoting the dissociation of the gas. Consequently, the entire apparatus is improved in plasma processing rate.

Moreover, the holes of the shield plate are aligned with only the orbit in which the gas having relatively high dissociation efficiency goes straight and the shield plate blocks the orbit in which the gas having relatively low dissociation efficiency goes straight, so that the plasma processing rate is increased.

Furthermore, the holes of the shield plate are varied in number with an in-plane position of the upper electrode, a plasma region can be formed in accordance with the in-plane position, and not only the plasma processing rate can be improved but also the distribution characteristics of plasma processing rate can be controlled. Since, in particular, the density of holes of the shield plate in the outer region of the upper electrode is set higher than that in the center thereof, the plasma processing rate can be uniformed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

First Embodiment

Figure 1:
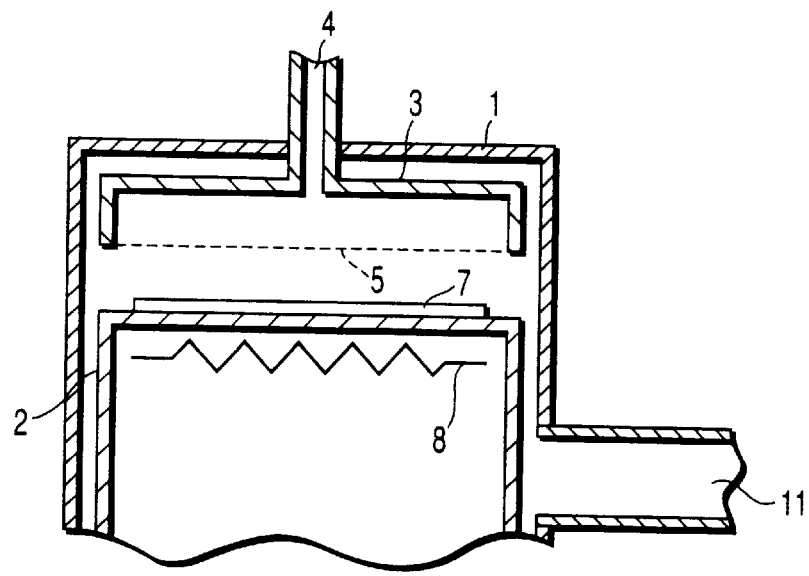
FIG. 1 is a general view of a prior art plasma processing apparatus.
Figure 2:
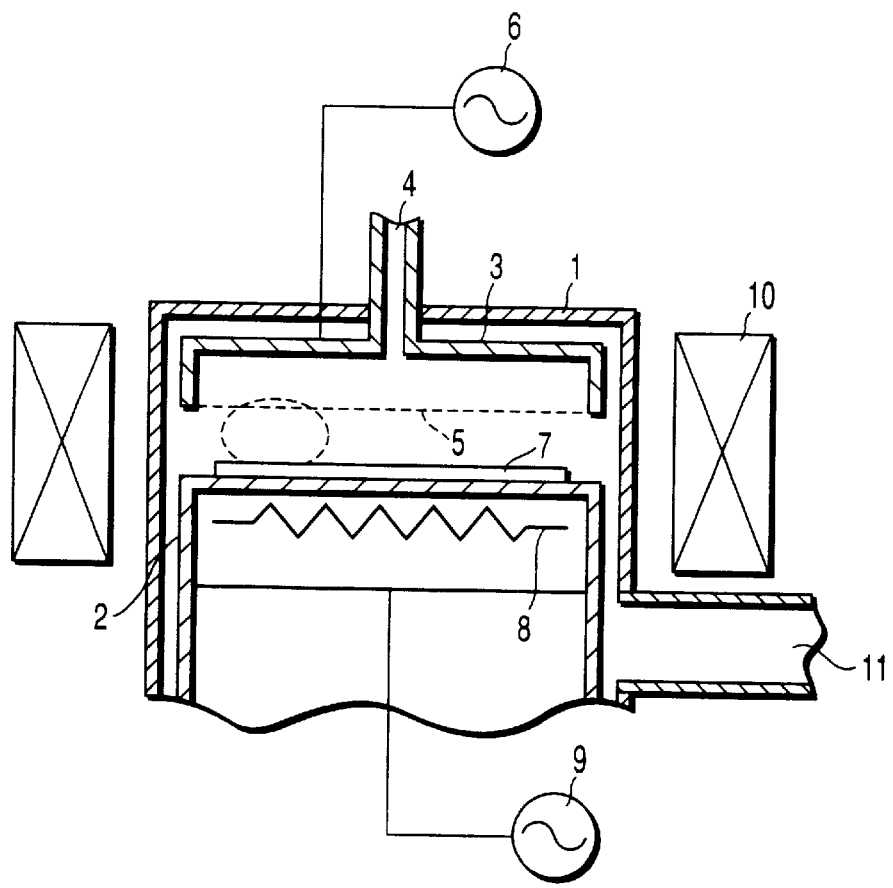
FIG. 2 is a general view of a structure of a plasma processing apparatus according to a first embodiment of the present invention.

FIG. 2 is a general view of a structure of a plasma processing apparatus according to a first embodiment of the present invention.

Referring to FIG. 2, a support table 2 serving as a lower electrode is provided in a reaction chamber 1, and an upper electrode 3 is opposed to the support table 2. The upper electrode 3 includes a gas pipe 4 for introducing gas from outside the chamber 1 and a plurality of gas introducing inlets 5 opposed to the support table 2. In the first embodiment, the gas pipe 4 has two channels, and two different gases are introduced through their respective channels. The gas inlets 5 are each constituted of a dispersion nozzle. The gas introduced through the gas pipe 4 is caused to flow into the chamber 1 through the plurality of gas inlets 5. Two high-frequency power supplies 6 are connected to the upper electrode 3.

A silicon wafer 7 is placed on the support table 2 as a subject to be processed. The support table 2 includes a resistance heating heater 8 for controlling temperature of the silicon wafer 7. Another high-frequency power supply 9 is connected to the support table 2.

A magnet 10 is disposed outside the reaction chamber 1 to generate a magnetic field on the wafer 7 and increase the density of discharged plasma. The chamber 1 includes a vacuum outlet 11 to allow plasma processing under a reduced pressure.

Figure 3A:
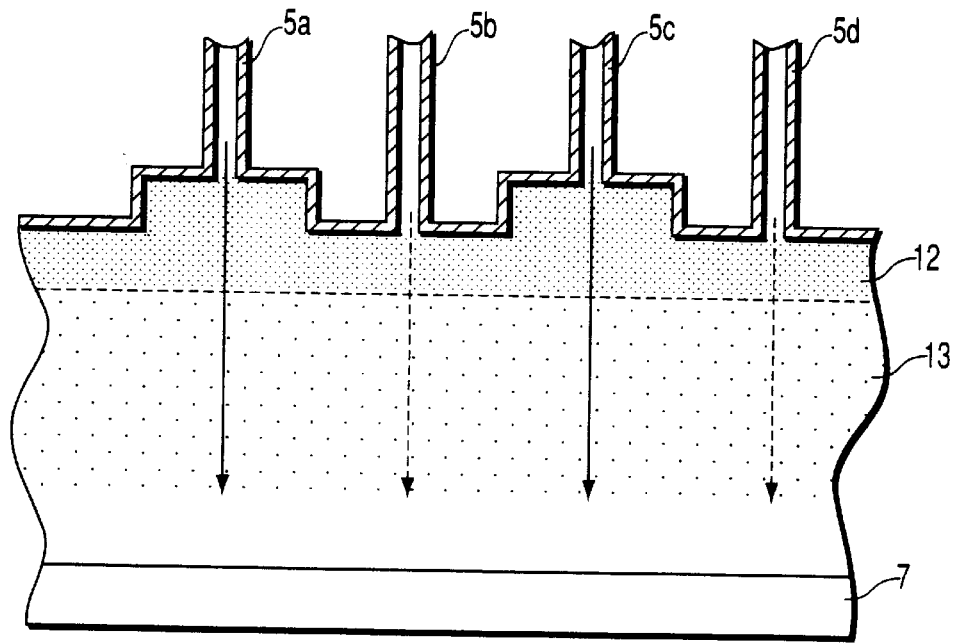
FIG. 3A is an enlarged cross-sectional view of an opening end portion of each of gas inlets of the apparatus shown in FIG. 2.

FIG. 3A is an enlarged view of a portion circled by a broken line in FIG. 2, showing a structure between the support table 2 and upper electrode 3 in detail. As shown in FIG. 3A, the gas inlets 5 are divided into two different types, i.e., gas inlets 5a and 5b arranged alternately. The open end of the gas inlet 5a is expanded in its diameter direction, whereas the gas inlet 5b has a uniform diameter in its open-end direction. The gas inlets 5a and 5b are so constituted that different gases are introduced thereinto from the two channels of the gas pipe 4. More specifically, gas whose dissociation efficiency is low in plasma, is introduced through the gas inlets 5a, while gas whose dissociation efficiency is high is introduced through the gas inlets 5b.

Hereinafter an operation of the plasma processing apparatus according to the first embodiment will be described. To be more specific, plasma CVD for depositing a silicon oxide thin film containing fluorine, to which the present invention is applied, will now be described.

First, the reaction chamber 1 is evacuated by the outlet 11, and then a silicon wafer 7 is placed on the support table 2 and heated to a desired temperature of 370° C. using the resistance heating heater 8. After that, material gases for forming a silicon oxide film are introduced through the gas inlets 5. As the material gases, $SiF_4$ of 25 cc/min (scum) and $O_2$ of 50 cc/min (scum) are introduced into the chamber 1 through their respective gas inlets 5a and 5b. A high-frequency voltage of 27.12 MHz is applied to the upper electrode 3 using the high-frequency power supplies 6, while a high-frequency voltage of 13.56 MHz is applied to the support table 2 using the high-frequency power supply 9. Plasma is thus discharged in the chamber 1 to form a silicon oxide film containing fluorine on the silicon wafer 7. The internal pressure of the chamber is 4 Pa and the intensity of the magnet 10 is 120 Gauss.

A plasma region is formed under the above conditions and divided into a high-density plasma region 12 and a low-density plasma region 13. The high-density plasma region 12 is concentrated near the upper electrode 3, while the low-density plasma region 13 is formed near the support table 2. The open end of the gas inlet 5a through which $SiF_4$ is introduced is expanded in its diameter direction, so that the high-density plasma region 12 is formed widely in a direction perpendicular to the surface of the support table 2. By contrast, since the gas inlet 5b through which $O_2$ is introduced has a uniform diameter, the high-density plasma region 12 formed near the open end of the gas inlet 5b is smaller than that formed near the open end of the gas inlet 5a. Consequently, a time period for which $SiF_4$ is exposed to the high-density plasma region 12 in the chamber 1 becomes longer than that for which $O_2$ is exposed thereto, with the result that the dissociation efficiency of $SiF_4$, which is lower than that of $O_2$, is improved.

If, as described above, the open ends of the gas inlets 5 are varied in shape with the dissociation efficiency of gases introduced into the chamber 1, the decomposition efficiency of gas reaching the low-density plasma region 13 is improved and so is the deposition rate of the silicon oxide film.

As compared with results of a conventional experiment carried out under the same deposition conditions using dispersion nozzles (gas inlets) having the same shape and the same diameter, an about 30% increase in deposition rate was confirmed in the experiment of the first embodiment conducted under the above conditions.

In the first embodiment, two types of gas inlets 5a and 5b, shown in FIG. 3A, are provided all over the electrode. However, the present invention is not limited to these gas inlets.

Figure 3B:
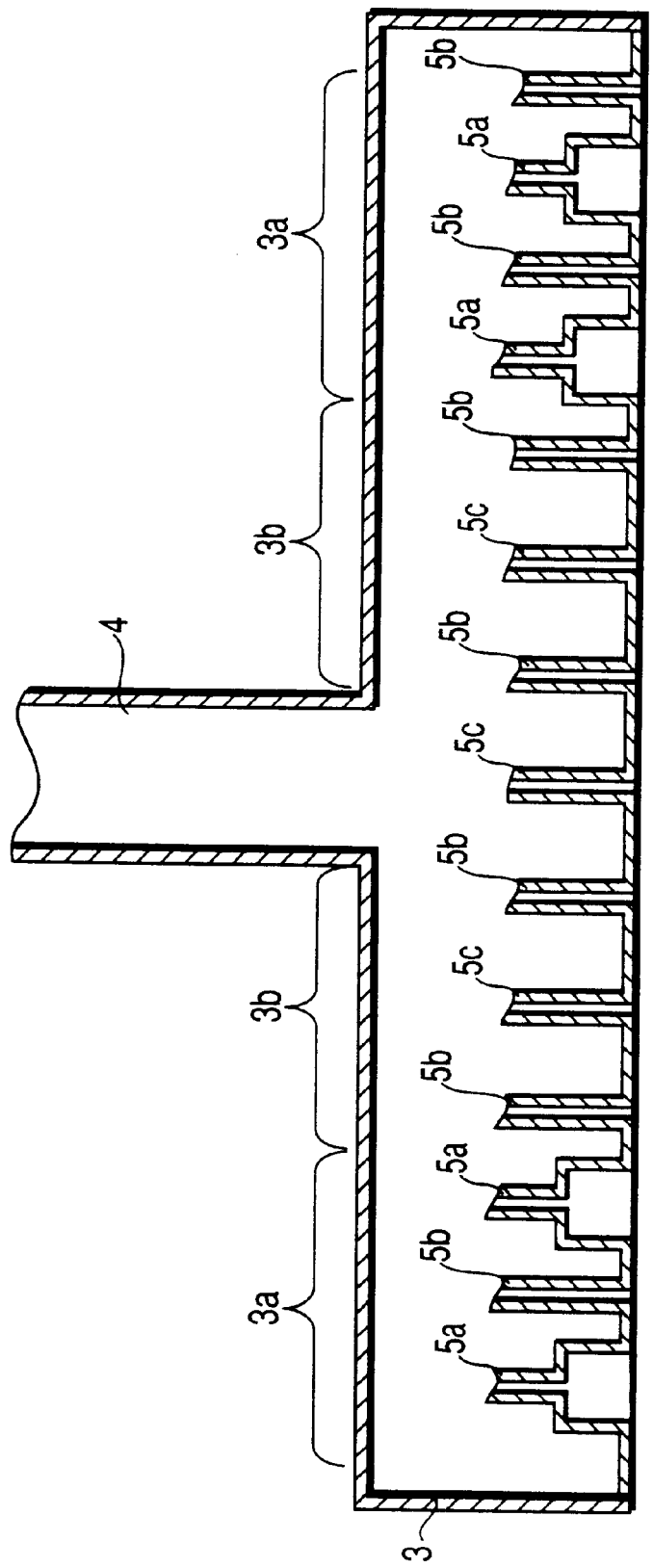
FIG. 3B is a cross-sectional view of a modification to the gas inlets of the apparatus shown in FIG. 2.

FIG. 3B is a cross-sectional view showing a modification to the upper electrode 3 of the apparatus according to the above first embodiment. The same constituting elements as those of FIGS. 2 and 3A are denoted by the same reference numerals. Referring to FIG. 3B, $SiF_4$ gas inlets 5a are provided only in the outer region 3a of the upper electrode 3, while $O_2$ gas inlets 5b and $SiF_4$ gas inlets 5c are provided in the inner region 3b thereof and their open ends have a uniform diameter. In this modification, not only the above deposition rate is increased, but also the deposition rate distribution characteristic on the entire surface of the silicon wafer 7 is improved, with the result the deposition rate is made more uniform than that in the case employing conventional gas inlets.

An experiment was performed for the above modification in which the gas inlets 5a each having an expanded open end were arranged only in the outer region of the electrode as shown in FIG. 3B, and resulted in that, when a film was deposited on a silicon wafer having an 8-inch outside diameter, a variation in in-plane deposition rate, which was 3 as a deviation (a so-called 1–σ value), was decreased to 1.5.

The present invention is not limited to the shape of the open end of the gas inlet 5a in the first embodiment. Any gas inlet can be used if its open end is expanded in its diameter direction. In other words, a gas inlet can be increased gradually in its diameter toward its open end as well as the gas inlet is increased step by step in its diameter from a given position toward its open end as in the first embodiment.

Second Embodiment

Figure 4:
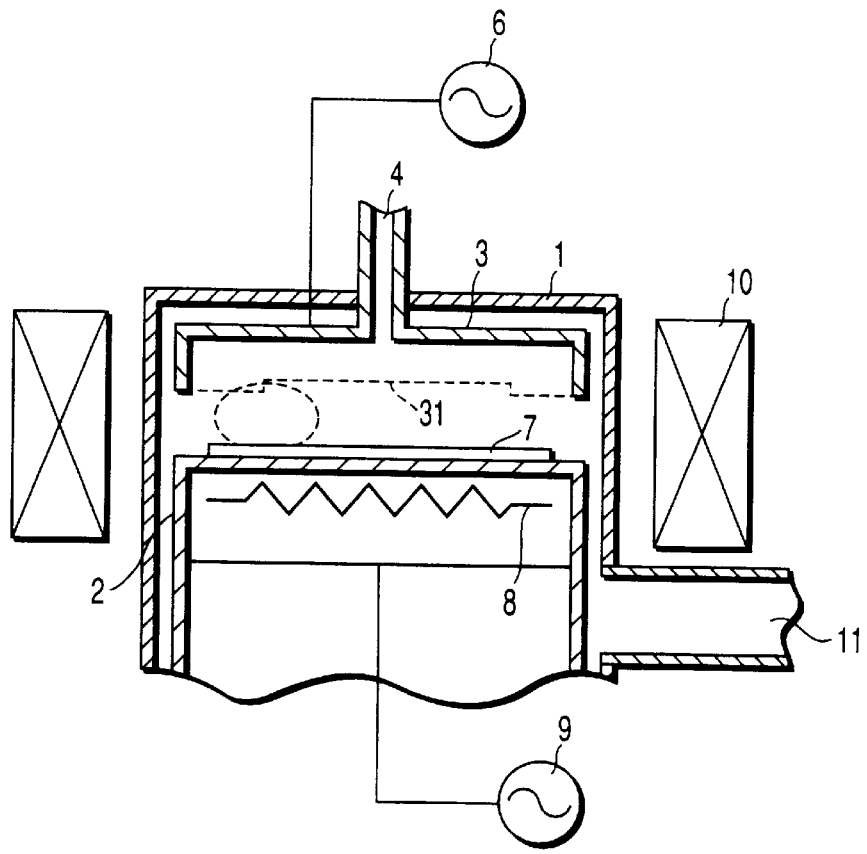
FIG. 4 is a general view of a structure of a plasma processing apparatus according to a second embodiment of the present invention.

FIG. 4 is a general view of a structure of a plasma processing apparatus according to a second embodiment of the present invention. The constituting elements common to those of the first embodiment are indicated by the same reference numerals, and their detailed descriptions are omitted.

Referring to FIG. 4, a plurality of gas inlets 31 are provided opposite to a support table 2 as those in FIG. 2. In the second embodiment, an upper electrode 3 is divided into an outer region and an inner region.

Figure 5:
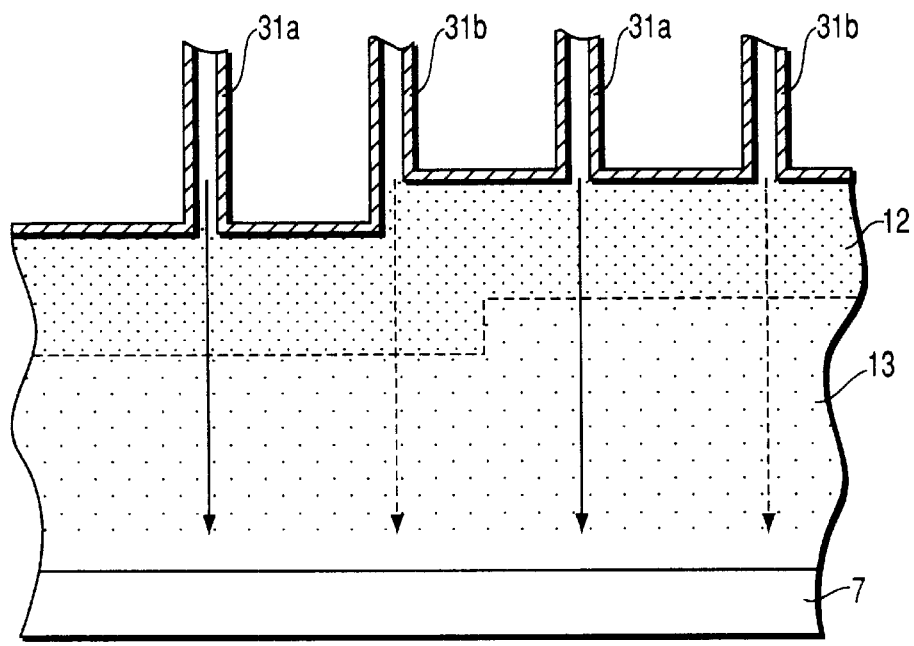
FIG. 5 is an enlarged cross-sectional view of an opening end portion of each of gas inlets of the apparatus shown in FIG. 4.

FIG. 5 is an enlarged view of a portion circled by a broken line in FIG. 4, showing a structure between the support table 2 and upper electrode 3 in detail. As shown in FIG. 5, the gas inlets are divided between the outer and inner regions. The diameter of the outer region is 220 mm, while that of the inner region is 150 mm, so that an electrode interval between the support table 2 on which a silicon wafer is placed and each of the inner and outer regions of the electrode 3 can be controlled independently of each other. In the second embodiment, the electrode interval between the table 2 and the outer region is set to 24 mm and that between the table 2 and the inner region is set to 25 mm.

Hereinafter an operation of the plasma processing apparatus according to the second embodiment will be described. More specifically, plasma CVD for depositing a silicon oxide thin film containing fluorine, to which the present invention is applied, will now be described.

First, a chamber 1 is evacuated by means of an outlet 11, and then a silicon wafer 7 is placed on the support table 2 and heated to a desired temperature of 370° C. using a resistance heating heater 8. After that, material gases for forming a silicon oxide film are introduced through the gas inlets 31. As the material gases, $SiF_4$ of 25 cc/min (scum) and $O_2$ of 50 cc/min (scum) are introduced into the chamber 1 through the gas inlets 31. A high-frequency voltage of 27.12 MHz is applied to the upper electrode 3 using a high-frequency power supply 6, while a high-frequency voltage of 13.56 MHz is applied to the support table 2 using another high-frequency power supply 9. Plasma is thus discharged in the chamber 1 to form a silicon oxide film containing fluorine on the silicon wafer 7. The internal pressure of the chamber is 4 Pa and the intensity of the magnet 10 is 120 Gauss.

A plasma region is formed under the above conditions and divided into a high-density plasma region 12 and a low-density plasma region 13. The high-density plasma region 12 is concentrated near the upper electrode 3, while the low-density plasma region 13 is formed near the support table 2. The electrode is divided into the outer and inner regions, and the electrode interval between the outer region and the support table 2 is narrower than that between the inner region and the table 2. It is thus possible to prevent plasma discharge efficiency from decreasing in the outer region of the electrode. In other words, the plasma discharge efficiency is lowered in the outer region because the pressure of the outer region is lower than that of the inner region; however, if the electrode interval between the outer region and the support table is set smaller than that between the inner region and the support table, a difference in pressure between the inner and outer regions can be decreased and the plasma discharge efficiency can be uniformed. Consequently, the deposition rate distribution characteristic within the silicon wafer 7 is improved.

Since the above electrode intervals are controlled so as to cancel out nonuniformity of pressure in the reaction chamber 1, the plasma discharge efficiency can be uniformed within the wafer plane and the deposition rate distribution characteristic is improved. Consequently, the thickness and quality (the composition of a compound) of a film deposited on a large-diameter wafer can be uniformed.

An experiment was performed under the above deposition conditions and resulted in that the deposition rate was made more uniform than that in the prior art experimental result where the electrode interval was constant. To be more specific, when a film was deposited on a silicon wafer having an 8-inch outside diameter, a variation in in-plane deposition rate, which was 3 as a deviation (a so-called 1–σ value), was decreased to 1.4.

In the second embodiment, the electrode interval between the support table 2 and each of the outer and inner regions of the upper electrode 3 is controlled. However, the electrode interval can be decreased continuously toward the outer region from the inner region, or it can be reduced step by step. If the apparatus has a structure capable of lessening a difference in pressure when a reaction occurs, the electrode interval can freely be controlled in accordance with the shape of the chamber 1. In the second embodiment, the electrode intervals in the inner and outer regions can be controlled independently of each other and accordingly the apparatus may or may not have a means for varying the electrode intervals.

Third Embodiment

Figure 6:
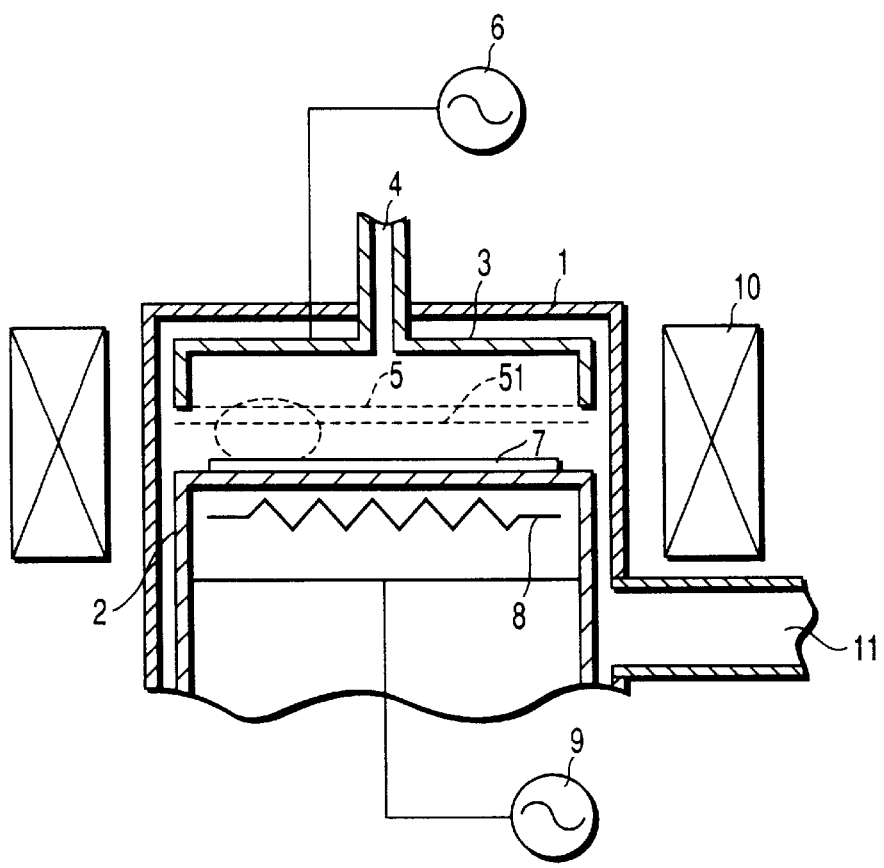
FIG. 6 is a general view of a structure of a plasma processing apparatus according to a third embodiment of the present invention.

FIG. 6 is a general view of a structure of a plasma processing apparatus according to a third embodiment of the present invention. The constituting elements common to those of the first and second embodiments are denoted by the same reference numerals, and their detailed descriptions are omitted.

As illustrated in FIG. 6, shield plates 51 are arranged between an upper electrode 3 and a support table 2.

Figure 7:
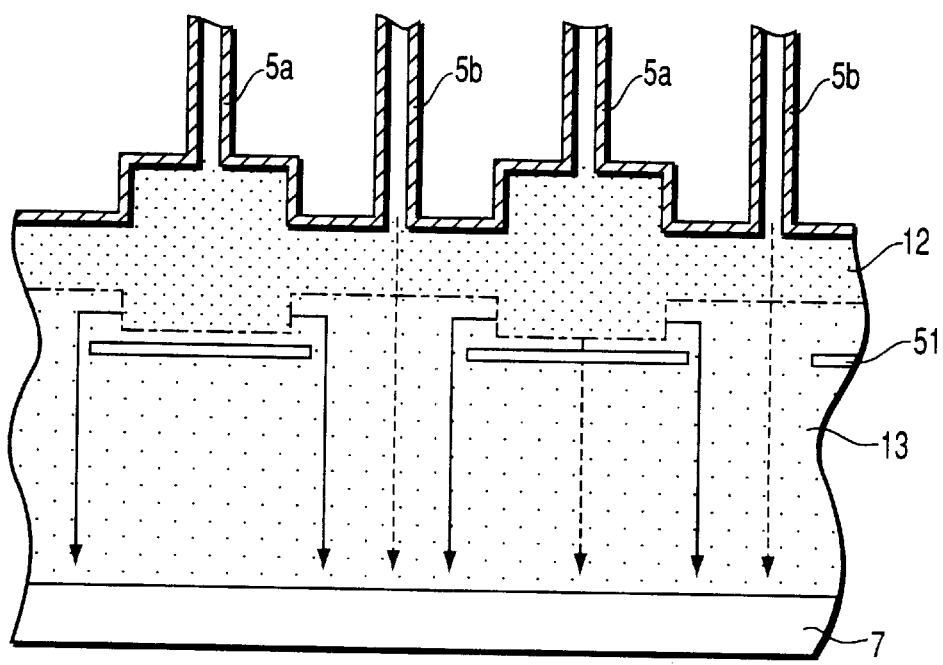
FIG. 7 is an enlarged cross-sectional view of an opening end portion of each of gas inlets of the apparatus shown in FIG. 6.

FIG. 7 is an enlarged view of a portion circled by a broken line in FIG. 6, showing a structure between the support table 2 and upper electrode 3 in detail. As shown in FIG. 7, a gas inlet 5 is divided into two types, i.e., gas inlets 5a and 5b arranged alternately. The open end of the gas inlet 5a is expanded in its diameter direction, whereas the gas inlet 5b has a uniform diameter in its open-end direction. The structures of the gas inlets 5a and 5b are the same as those in the first embodiment.

The shield plates 51 have the same number of holes as that of gas inlets 5a. These holes are aligned with an orbit in which gas emitted from the gas inlets 5a goes straight. No holes are formed along an orbit in which gas emitted from the gas inlets 5b goes straight, and the shield plates 51 are arranged so as to block the gas emitted from the gas inlets 5b. In other words, gas of relatively low dissociation efficiency is blocked by the shield plates 51, and gas of relatively high dissociation efficiency flows through the holes of the shield plates 51. It is desirable that the shield plates 51 be formed of insulating materials, but in the third embodiment they are quartz porous plates.

Hereinafter an operation of the plasma processing apparatus according to the above third embodiment will be described. To be more specific, plasma CVD for depositing a silicon oxide thin film containing fluorine, to which the present invention is applied, will now be described.

First, a reaction chamber 1 is evacuated by an outlet 11, and then a silicon wafer 7 to be processed is placed on the support table 2 and heated to a desired temperature of 370° C. using a resistance heating heater 8. After that, material gases for forming a silicon oxide film are introduced through the gas inlets 5. As the material gases, $SiF_4$ of 25 cc/min (scum) and $O_2$ of 50 cc/min (scum) are introduced into the chamber 1 through their respective gas inlets 5a and 5b. A high-frequency voltage of 27.12 MHz is applied to the upper electrode 3 using a high-frequency power supply 6, while a high-frequency voltage of 13.56 MHz is applied to the support table 2 using another high-frequency power supply 9. Plasma is thus discharged in the chamber 1 to form a silicon oxide film containing fluorine on the silicon wafer 7. The internal pressure of the chamber is 4 Pa and the intensity of a magnet 10 is 120 Gauss.

A plasma region is formed under the above conditions and divided into a high-density plasma region 12 and a low-density plasma region 13. The high-density plasma region 12 is concentrated near the upper electrode 3, while the low-density plasma region 13 is formed near the support table 2. The open end of the gas inlet 5a through which $SiF_4$ is introduced is expanded in its diameter direction, so that the high-density plasma region 12 is formed widely in a direction perpendicular to the surface of the support table 2. By contrast, since the gas inlet 5b through which $O_2$ is introduced has a uniform diameter, the high-density plasma region 12 formed near the open end of the gas inlet 5b is smaller than that formed near the open end of the gas inlet 5a. The dissociation efficiency of $SiF_4$, which is lower than that of $O_2$, is thus improved.

If the shield plates 51 are provided when there is a difference in dissociation efficiency due to a difference in shape between the open ends of the gas inlets 5a and 5b, SiF$_4$ emitted from the gas inlets 5a flows through the high- and low-density plasma regions 12 and 13 and collides with the shield plates 51 and then returns to the high-density plasma region 12. Therefore, the dissociation of SiF$_4$ is promoted and thus the deposition rate can be improved further.

Since, as described above, the open ends of the gas inlets 5 are expanded in the diameter direction in accordance with the dissociation efficiency of gas introduced into the chamber 1, the decomposition efficiency of gas is improved and so is the deposition rate. Since, moreover, the shield plates 51 are provided between the upper electrode 3 and support table 2, gas which is not dissociated sufficiently, can be returned to the high-density plasma region 12 and thus the decomposition efficiency of gas is improved further.

An experiment was conducted under the above conditions and resulted in that the deposition rate was improved about 50% as compared with the results of a conventional experiment carried out under the same deposition conditions using gas inlets having the same shape and providing no shield plates.

Figure 8:
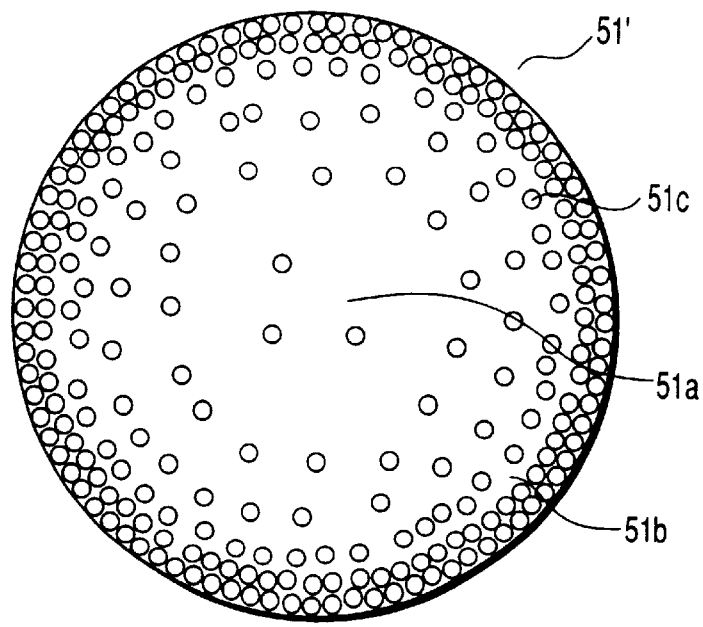
FIG. 8 is a view of a modification to a shield plate of the apparatus shown in FIG. 6.

In the third embodiment, the percentage of the gas inlets 5a blocked by the shield plates 51 is not varied from the inner and outer regions of the upper electrode 3; however, the present invention is not limited to this. A modification to the shield plates 51 is illustrated in FIG. 8. FIG. 8 is a top view of a shield plate 51', and the plate 51' includes an inner region 51a and its surrounding outer region 51b. If the density of holes 51c in the outer region 51b is set higher than that of holes 51c in the inner region 51a, plasma discharge efficiency can be increased in the outer region whose pressure is relatively low, and in-plane uniformity of deposition rate can be improved further. When a film was deposited on a silicon wafer having an 8-inch outside diameter using an apparatus including such a shield plate, a variation in in-plane deposition rate, which was 3 as a deviation (a so-called 1–σ value), was decreased to 1.5.

The present invention is not limited to the first to third embodiments described above. These embodiments are directed to plasma CVD processing using SiF$_4$ and O$_2$ gases; however, the present invention is not limited to these gases but can be applied to plasma CVD processing using whatever gas. Moreover, in the above embodiments, a high-frequency voltage of 27.12 MHz is applied to the upper electrode 3 and a high-frequency voltage of 13.56 MHz is applied to the support table 2 serving as a lower electrode. However, the present invention is not limited to this. Even though two different high-frequency voltages are superimposed on the upper electrode 3 or support table 2 or any combination of different high-frequency voltages is used, the same advantage can be obtained.

In the foregoing embodiments, a magnet is employed. However, the same advantage can be obtained without using any magnet. Furthermore, the above embodiments are applied to a plasma processing apparatus of a parallel-plate type. The same advantage can be obtained from a plasma processing apparatus including at least a dispersion nozzle. The above embodiments of the present invention refers to plasma CVD as plasma processing; however, the present invention can be applied to all types of plasma processing such as plasma cleaning processing, ion etching processing (RIE), and plasma downstream processing.

In the third embodiment of the present invention, a quartz porous plate is employed as an insulation plate having a plurality of holes. The present invention is not limited to this. Even if the quartz porous plate is replaced with an alumina or silicon nitride plate of an insulator or a silicon plate, the same advantage can be obtained. Various changes and modifications can be made without departing from the scope of the specification and claims of the present application.

According to one aspect of the present invention detailed above, since at least some of gas inlets are expanded in the diameter direction at their open ends, the high-density plasma region is not concentrated near the upper electrode and thus the dissociation efficiency of gas is increased and the plasma processing speed is improved.

According to another aspect of the present invention, since a distance between the lower electrode and the open end of each of the plural gas inlets is varied with the in-plane position of the upper electrode, the distribution characteristics of plasma processing speed can be controlled.

According to still another object of the present invention, since a shield plate having a plurality of holes is disposed between the upper and lower electrodes, gas which is introduced from the gas inlets and is relatively hard to dissociate, collides with the shield plate and returns to the high-density plasma region, thereby promoting gas dissociation and improving plasma processing speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing apparatus of a parallel-plate type comprising a lower electrode on which a subject to be processed is placed and an upper electrode opposed to the lower electrode and having a plurality of gas inlets facing the lower electrode, wherein at least some of the plurality of gas inlets are expanded in a diameter direction at open ends thereof.

2. The plasma processing apparatus according to claim 1, wherein the plurality of inlets includes first gas inlets for introducing a first material gas whose dissociation efficiency is low in the plasma and second gas inlets for introducing a second material gas whose dissociation efficiency is high in the plasma, and the first gas inlets are expanded in a diameter direction at open ends thereof more greatly than the second gas inlets.

3. The plasma processing apparatus according to claim 1, wherein the open ends of the inlets are varied in diameter with an in-plane position of the upper electrode.

4. The plasma processing apparatus according to claim 1, wherein the plurality of inlets include first gas inlets for introducing a first material gas whose dissociation efficiency is low in the plasma and second gas inlets for introducing a second material gas whose dissociation efficiency is high in the plasma the upper electrode includes an inner region and an outer region surrounding the inner region, and the first gas inlets in the outer region of the upper electrode are expanded in a diameter direction at open ends thereof more greatly than the second gas inlets.

5. The plasma processing apparatus according to claim 1, wherein the plurality of inlets include first gas inlets for Introducing a first material gas whose dissociation efficiency is low in the plasma and second gas inlets for introducing a second material gas whose dissociation efficiency is high in the plasma, the upper electrode includes an inner region and an outer region surrounding the inner region, and the first gas inlets in the outer region of the upper electrode are expanded in a diameter direction at open ends thereof more greatly than the first gas inlets in the inner region of the upper electrode.

6. A plasma processing apparatus of a parallel-plate type comprising a lower electrode on which a subject to be processed is placed and an upper electrode opposed to the lower electrode and having a plurality of gas inlets facing the lower electrode, wherein an interval between the lower electrode and open ends of the plurality of inlets is varied with an in-plane position of the upper electrode.

7. The plasma processing apparatus according to claim 6, wherein the upper electrode includes an inner region and an outer region surrounding the inner region, and an interval between the lower electrode and the open ends of the inlets in the inner region of the upper electrode is set larger than that between the lower electrode and the open ends of the inlets in the outer region of the upper electrode.

8. A plasma processing apparatus of a parallel-plate type comprising a lower electrode on which a subject to be processed is placed and an upper electrode opposed to the lower electrode and having a plurality of gas inlets facing the lower electrode, wherein a shield plate having a plurality of holes is disposed between the upper electrode and the lower electrode.

9. The plasma processing apparatus according to claim 8, wherein the holes of the shield plate are aligned with an orbit in which gas having high dissociation efficiency in the plasma goes straight through the gas inlets, and the shield plate is disposed so as to block an orbit in which gas having low dissociation efficiency in the plasma goes straight.

10. The plasma processing apparatus according to claim 8, wherein the holes of the shield plate are varied in number with an in-plane position of the upper electrode.

11. The plasma processing apparatus according to claim 8, wherein the upper electrode includes an inner region and an outer region surrounding the inner region, and the density of holes of the shield plate in the outer region of the upper electrode is set higher than that in the inner region thereof.

* * * * *

UNITED STATES PATENT AND TRADEMARK OFFICE
CERTIFICATE OF CORRECTION

PATENT NO.    : 6,344,420 B1
DATED         : February 5, 2002
INVENTOR(S)   : Hideshi Miyajima et al.

It is certified that error appears in the above-identified patent and that said Letters Patent is hereby corrected as shown below:

<u>Column 10,</u>
Line 56, after "the plasma", insert comma -- , --.
Line 63, "Introducing" should read -- introducing --.

Signed and Sealed this

Twenty-first Day of May, 2002

Attest:

Attesting Officer

JAMES E. ROGAN
*Director of the United States Patent and Trademark Office*